(12) United States Patent
Swanson

(10) Patent No.: US 6,780,662 B2
(45) Date of Patent: Aug. 24, 2004

(54) SELECTIVE DEPOSITION OF EMISSIVE LAYER IN ELECTROLUMINESCENT DISPLAYS

(75) Inventor: Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/625,891

(22) Filed: Jul. 23, 2003

(65) Prior Publication Data

US 2004/0086628 A1 May 6, 2004

Related U.S. Application Data

(62) Division of application No. 10/346,931, filed on Jan. 17, 2003, now abandoned, which is a division of application No. 09/714,672, filed on Nov. 16, 2000, now Pat. No. 6,537,607.

(51) Int. Cl.[7] .............................................. H01L 21/00
(52) U.S. Cl. .............................. 438/34; 438/99; 438/66
(58) Field of Search ............................... 438/21–30, 99, 438/780, 34, 35; 427/66, 68, 70; 313/500–507; 428/690

(56) References Cited

U.S. PATENT DOCUMENTS

| | | |
|---|---|---|
| 4,720,436 A | 1/1988 | Ohseto et al. |
| 5,093,698 A | 3/1992 | Egusa |
| 5,317,169 A | 5/1994 | Nakano et al. |
| 5,399,936 A | 3/1995 | Namiki et al. |
| 5,405,709 A | 4/1995 | Littman et al. |
| 5,482,896 A | 1/1996 | Tang |
| 5,721,160 A | 2/1998 | Forrest et al. |
| 5,726,457 A | 3/1998 | Nakano et al. |
| 5,844,363 A | 12/1998 | Gu et al. |
| 6,296,894 B1 | 10/2001 | Tanabe et al. |
| 6,337,102 B1 | 1/2002 | Forrest et al. |
| 6,469,439 B2 | 10/2002 | Himeshima et al. |

FOREIGN PATENT DOCUMENTS

| | | |
|---|---|---|
| WO | WO99/20080 | 4/1999 |

Primary Examiner—Savitri Mulpuri
(74) Attorney, Agent, or Firm—Rose Alyssa Keagy; W. James Brady, III; Frederick J. Telecky, Jr.

(57) ABSTRACT

A method for forming an emissive layer for an electroluminescent display is provided that includes positioning a substrate (40) in spaced relation to a port (88) of a micro-effusion cell (86). The method then provides for transporting the substrate (40) across the port (88) at a substantially constant rate. The method then provides for effusing an emissive material from the port (88) and adhering at least a portion of the emissive material effused from the port (88) to a defined region of the substrate (40) to form an emissive strip (46) having a substantially constant width on the substrate (40).

3 Claims, 3 Drawing Sheets

SELECTIVE DEPOSITION OF EMISSIVE LAYER IN ELECTROLUMINESCENT DISPLAYS

This is a division of application Ser. No. 10/346,931, filed Jan. 17, 2003 now abandoned, which is a division of, and claims priority to, parent application Ser. No. 09/714,672, filed Nov. 16, 2000 and issued Mar. 25, 2003 as U.S. Pat. No. 6,537,607, the entire disclosure of which is hereby incorporated herein by reference.

BACKGROUND OF THE INVENTION

Flat screen displays are provided by light blocking, reflecting technologies, and light emitting technologies. One type of light blocking flat screen display is a liquid crystal display (LCD). LCDs are based on blocking light from a separate light source behind an LCD panel. One type of light emitting flat screen display is based on light emitting diodes (LEDs). Since light emitting displays generate light, a separate light source is not used.

Light emitting displays include cathode ray tube (CRT), plasma discharge, thin film electroluminescent, and light emitting diode (LED) based architectures. The LED's can be either discrete inorganic (i.e., III–V or II–I compound semiconductor devices) or thin film organic diodes. Thin films of organic compounds offer the potential to realize optoelectronic devices with properties unattainable with conventional semiconductor materials. Organic electroluminescent devices are of considerable interest in various display applications because of their high efficiency and variation in colors. Using multilayer structures, emitting layers, transport and luminescent materials, including polymers, and efficient injection contacts, these organic-based devices can be operated with a DC voltage as low as a few volts and provide luminous efficiencies greater than 1 lm/W over a wide spectral range, making possible the fabrication of a full-color display panel.

Organic light emitting material recombines a hole and an electron thereby creating a photon of energy in the form of visible light. Since color displays require a combination of colors, the organic materials used in light emitting displays need to be organized and patterned to provide a color element for each pixel. Conventional patterning techniques such as photoresist techniques are not applicable to patterning organic materials since the solvent used in photoresist techniques cannot distinguish between the resist material and the organic material.

One method of patterning organic materials is the use of a shadow mask. The use of shadow masks includes building vertical columns and depositing the organic material on a substrate from an angle. Since the material is deposited at an angle, each vertical column creates a shadow area behind the column that does not receive the deposited material. Although this method has been used for integrated circuit fabrication, the use of this method for large flat screen light emitting displays is impractical since the vertical columns would lose stability as height increases. In flat screen displays, the larger the display, the larger the pixel. Since multiple colors are necessary to create a color display, multiple shadow masks and several fabrication steps are needed. Using multiple shadow masks slows down the processing time and increases the cost of the devices.

SUMMARY OF THE INVENTION

In accordance with the present invention, an improved method for selective deposition of an emissive layer in electroluminescent displays is provided that substantially eliminates or reduces disadvantages and problems associated with conventional fabrication techniques.

According to an embodiment of the present invention, there is provided a method for forming an emissive layer for an electroluminescent display that includes positioning a substrate in spaced relation to a port of a microeffusion cell and transporting the substrate across the port at a substantially constant rate. The method then provides for effusing an emissive material from the port and adhering at least a portion of the emissive material effused from the port to a defined region of the substrate to form an emissive strip having a substantially constant width on the substrate.

The present invention provides various technical advantages over conventional fabrication techniques for light emitting displays. One technical advantage is that the present invention provides a continuous process for fabricating flat panel displays. In particular, emissive and other layers are continuously formed. Another technical advantage is that by using selective deposition for the emissive layer, any patterning steps are eliminated. This leads to reduced fabrication time and fewer fabrication processing steps. Another technical advantage is that manufacturing costs are reduced as compared to using fabrication techniques such as shadow masking. Other technical advantages may be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numbers represent like parts, in which.

DETAILED DESCRIPTION OF THE DRAWINGS

Figure 1:
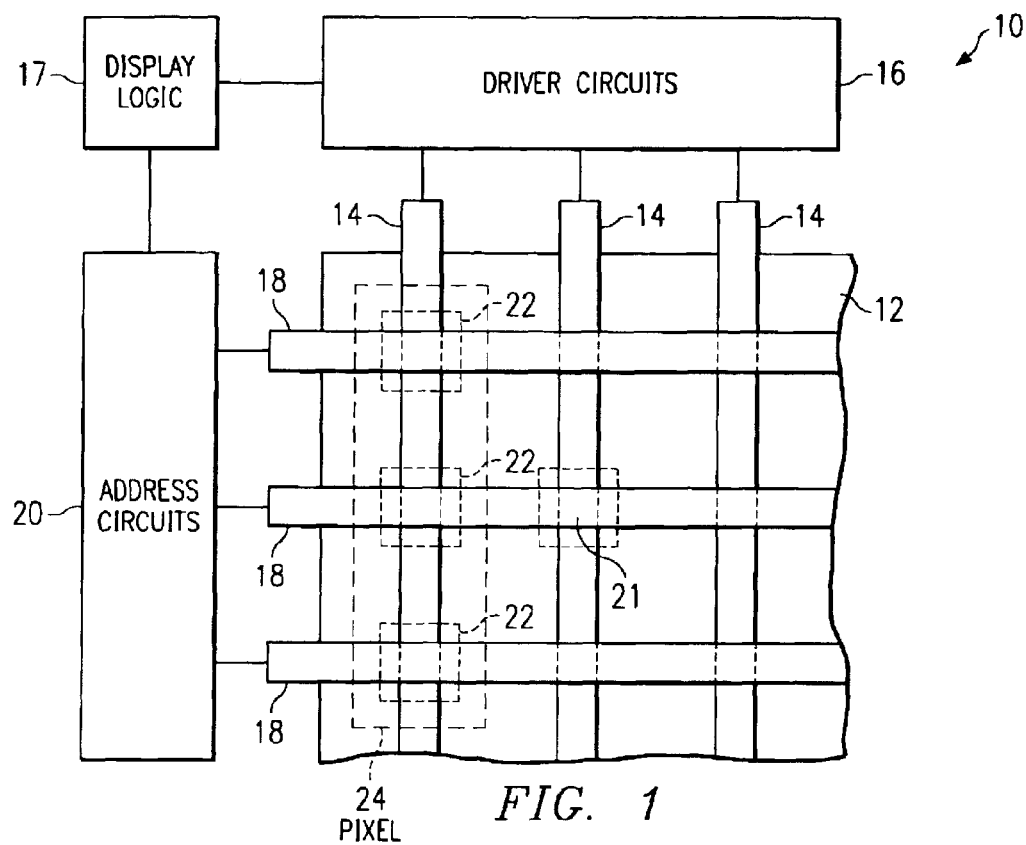
FIG. 1 illustrates a flat screen display architecture in accordance with one embodiment of the present invention.

Referring to FIG. 1, a flat panel display is generally indicated at 10. The flat panel display 10 includes a display grid 12, driver circuits 16 and address circuits 20 for driving the display grid 12, and display logic 17 for operating the driver circuits 16 and address circuits 20.

The display grid 12 includes a plurality of column contacts 14 extending substantially perpendicularly to a plurality of row contacts 18. An intersection 21 is formed where a column contact 14 intersects a row contact 18. As described in more detail below, each intersection 21 includes an emissive layer disposed between the column contact 14 and the row contact 18. Each intersection 21 area together with the corresponding emissive layer forms a color element 22 that emits light in response to activation of the intersection 21 by the driver circuits 16 and the address circuits 20.

Color elements 22 emit light in one of a plurality of colors. In one embodiment, the plurality of colors includes red, green, and blue to form an RGB (red-green-blue) display. These colors alternate such that a group of color elements 22 forms a pixel 24. In one embodiment, each pixel 24 includes a red color element 22 to emit light in the red spectrum, a green color element 22 to emit light in the green spectrum, and a blue color element 22 to emit light in the blue spectrum. However, any combination of color elements 22 may be used. For example, in order to increase brightness of a particular color element 22, a pixel 24 may have more than one of the particular color element 22 depending on the relative brightness of each color element 22. For a particular display format, a larger panel size translates into a larger pixel size. However, to improve resolution, smaller pixels may be used. In one embodiment, each color element 22 in pixel 24 is between 0.5 mm and 1 mm wide. However, the present invention may be used to fabricate color element sizes in excess of 1 mm wide and less than 0.5 mm.

Display logic 17 receives and decodes video signals. Driver circuit 16 activates column contacts 14 based on instructions received from display logic 17. For display of television and other video signals, address circuit 20 activates one row contact 18, or one group of row contacts 18 constituting a pixel 24, at a time. Address circuit 20 sequentially activates each row in the flat panel display 10. When a particular column contact 14 and row contact 18 are activated, a potential is induced across the intersection of the two contacts and this creates an electrical current at the intersection. This current causes the emissive layer within color element 22 at each intersection to emit photons of light followed by a decay period. Since the photons of light are emitted by the emissive layer within the color element 22, one of the contacts, either column contact 14 or row contact 18, should be optically transparent. In one embodiment, the optically transparent contact is formed from indium-tin-oxide (ITO). However, any suitable optically transparent electrically conductive metal oxide may be used such as zinc oxide.

Figure 2:
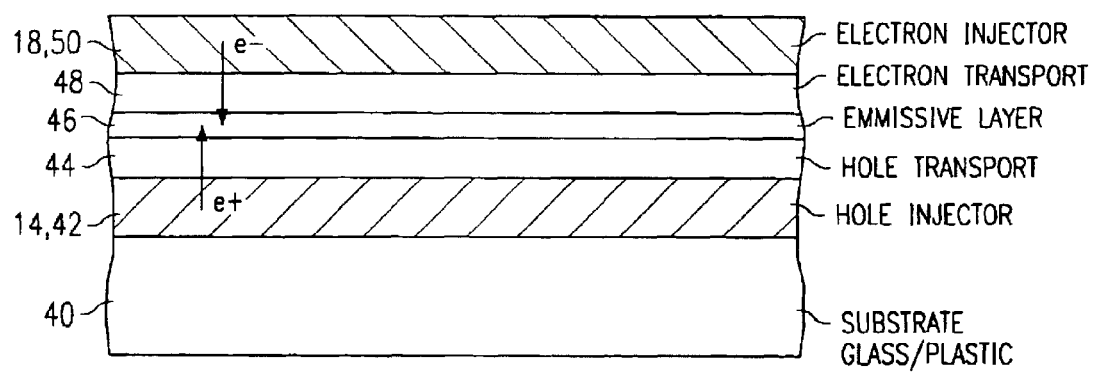
FIG. 2 illustrates a cross-section through a color element of the flat screen display architecture of FIG. 1 in accordance with one embodiment of the present invention.

Referring to FIG. 2, a cross-section of a color element 22 is illustrated. The flat panel display 10 is supported by an optically transparent substrate 40. optically transparent substrate 40 may be any suitable substrate that is transparent in the visible spectrum including glass and plastic. Each color element 22 includes a hole injector layer 42, a hole transport layer 44, an emissive layer 46, an electron transport layer 48, and an electron injector layer 50. A hole injector layer 42 releases holes (positive charge carriers) in response to an electrical potential across an intersection 21 between a column contact 14 and a row contact 18. Positive charge carriers are regions of molecules that are missing an electron. Hole transport layer 44 transports holes to the adjacent layer and inhibits the transfer of electrons. Electron injector layer 50 releases an electron in response to an electrical potential across an intersection 21 between a column contact 14 and a row contact 18. Electron transfer layer 48 transports electrons to the adjacent layer and inhibits the transfer of holes. Emissive layer 46 emits photons of light in a specified portion of the visible spectrum in response to holes combining with electrons.

Column contacts 14 are disposed on substrate 40. In one embodiment, column contact 14 comprises a hole injector layer 42 formed from an optically transparent metal oxide such as ITO. In addition, hole injector layer 42 should be formed from a high work function metal. A high work function metal typically has a work function greater than or equal to 4.0 eV. Column contacts 14 are formed from hole injector layer 42 and function as an anode for color element 22. The material used to form hole injector layer 42 may be characterized by its ability to release holes in response to an electrical potential.

A hole transport layer 44 is disposed on hole injector layer 42. The hole transport layer 44 typically comprises an aromatic diamine but may be any suitable hole transport material. Aromatic diamines are characterized by their ability to transport holes, but not electrons, from one side of an aromatic diamine layer to an opposite side of the aromatic diamine layer. In addition, aromatic diamines produce films that are optically smooth and amorphous. An example of this type of aromatic diamine is triphenyldiamine.

Emissive layer 46 is disposed on hole transport layer 44. Emissive layer 46 is formed from a material that can emit a photon of light in a specified portion of the visible spectrum in response to activation of a column contact 14 and a row contact 18. In one embodiment, emissive layer 46 may be formed from a luminescent film belonging to the class of flourescent metal chelate complexes. An example of a flourescent metal chelate complex would be tris(8-hydroxyquinoline)aluminum (ALQ3).

An electron transport layer 48 is disposed on emissive layer 46. The material used to form electron transport layer 48 may be characterized by its ability to transport electrons, but not holes, from one side of a material layer to an opposite side of the material layer. Electron transport layer 48 may be formed from oxadiazole derivatives.

A row contact 18 is disposed on electron transport layer 48. In one embodiment, row contact 18 is an electron injector layer 50 formed from a magnesium and silver alloy with a ratio of 10 to 1. A low work function metal should be used. A low work function metal typically has a work function less than 4.0 eV. However, any suitable metal may be used. Row contacts 18 are formed from electron injector layer 50 and function as a cathode for color element 22.

In operation, the presence of an electrical current causes hole injector layer 42 (high work function anode)to inject a hole that is transported through hole transport layer 44 into emissive layer 46 where it stops and awaits an electron from electron injector layer 50. Electron injector layer 50 (low work function cathode) injects an electron that is transported through electron transport layer 48 into emissive layer 46. The injected hole and injected electron-meet in a molecule in emissive layer 46 where they recombine to form a luminescent excited state. The luminescent excited state releases a photon of light with a quantum efficiency that is determined by the types of molecules used in the various layers and the device architecture.

Figure 3:
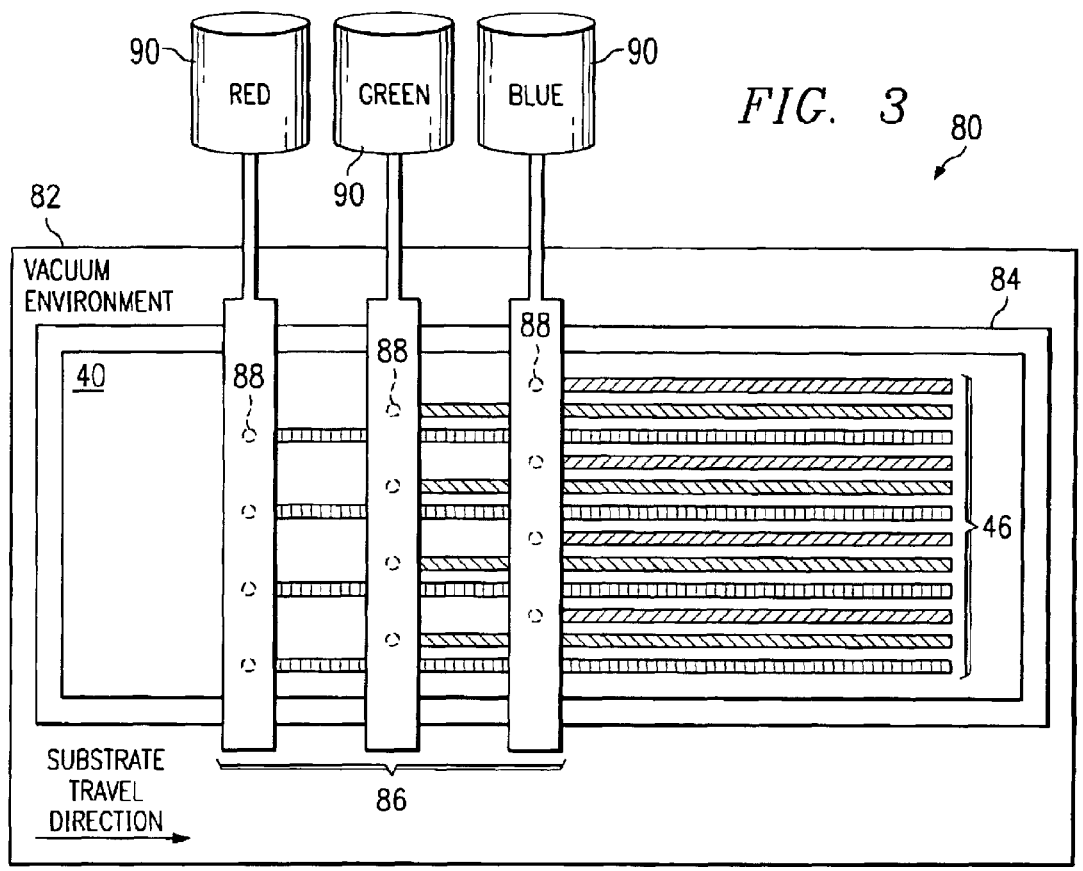
FIG. 3 illustrates an apparatus for selective deposition of an emissive layer for use in an electroluminescent display.

FIG. 3 illustrates an apparatus for depositing the emissive layer 46 in accordance with one embodiment of the present invention. In this embodiment, the emissive layer 46 comprises discrete red, green, and blue strips to form color display pixels 24. It should be understood that other disparate strips can be formed in accordance with the present invention.

Referring to FIG. 3, a bottom view of an apparatus for selectively depositing emissive layer 46 is generally indicated at 80. The apparatus 80 includes a pressure controlled vacuum environment 82, a conveyer 84, one or more microeffusion cells 86, and material source 90 coupled to each microeffusion cell 86.

Pressure controlled vacuum environment 82 houses conveyer 84 and microeffusion cells 86 and provides for continuous insertion and removal of the substrate 40 for selective deposition of the emissive layer 46. As described in further detail below, the vacuum in pressure controlled vacuum environment 82 facilitates the selective deposition of the emissive layer 46.

The conveyor 84 conveys substrate 40 over the one or more microeffusion cells 86. Microeffusion cells 86 selectively deposit materials from the-coupled source 90 on to the substrate 40 as it is conveyed across the microeffusion cells. This results in strips of material being deposited on substrate 40. Although apparatus 80 is used to deposit emissive layer 46, it may be used to deposit any appropriate materials.

In one embodiment, three microeffusion cells 86 are used corresponding to the red, green, and blue color elements 22 of a pixel 24. Each microeffusion cell 86 is coupled to an appropriate material source 90 to provide an emissive layer strip for a color element 22 forming a pixel 24. Each microeffusion cell includes a plurality of ports 88 through which material is effused onto substrate 40. The ports 88 in microeffusion cells 86 are offset from each other to form an appropriate sequence of emissive layer strips 46. In one embodiment, the sequence of emissive layer strips 46 includes red, followed by green, followed by blue, and repeating thereafter. The plurality of ports 88 allow all of the color elements for the electroluminescent display to be continuously formed in one pass of substrate 40 over the plurality of microeffusion cells 86.

Microeffusion cells 86 create thin strips on substrate 40 by substrate 40 being close to ports 88. These thin strips may be between 0.5 mm and 1 mm wide. The distance between substrate 40 and ports 88 may be varied to control deposition of the emissive layer strips 46. In one embodiment, substrate 40 is conveyed across ports 88 at a distance of approximately 0.2 mm. The distance between substrate 40 and ports 88 may be varied to alter the width of each emissive layer strip 46.

The material in material source 90 may be in the form of a solid, liquid, or gas. In one embodiment, the material in material source 90 used to form emissive layer strips 46 is a solid in powder form. In this embodiment, ports 88 point up to prevent the powder from being prematurely removed from microeffusion cell 86 by the force of gravity. Therefore, substrate 40 is attached to the bottom surface of conveyor 84 such that ports 88 of microeffusion cells 86 deposit material up through ports 88 onto substrate 40.

In operation, as substrate 12 is conveyed across the plurality of microeffusion cells 86, emissive layer strips 46 are deposited through the plurality of ports 88. The rate of conveyor 84 is initially determined by the effusion rate of vaporized emissive material from the plurality of microeffusion cells 86 and by the desired thickness of emissive layer 46. The conveyor rate may be generally limited by the slowest effusion rate among the plurality of microeffusion cells 86. Finally, the distance from substrate 40 to port 88 is initially chosen to provide a certain width of each emissive layer strip 46. The distance between substrate 40 and ports 88 may be changed to control the width of each emissive layer strip 46. In one embodiment, the substrate 40 is less than 0.2 mm from port 88. However, any suitable distance may be used based on variables such as desired width of emissive layer strips 46 or desired thickness of emissive layer strips 46.

The powder material in material source 90 is deposited on substrate 40 with a sublimation process. When a solid is sublimated, it is converted directly from the solid state into a gaseous state. In one embodiment, this conversion is done through the application of heat in microeffusion cell 86 to the emissive material. Microeffusion cells 86 are heated to a temperature where the emissive material is converted into a vapor that is expelled through ports 88 onto substrate 40. In addition, a pressure differential between the interior of microeffusion cell 86 and the pressure controlled vacuum environment 82 causes the vapor to be pulled from microeffusion cell 86. More specifically, pressure controlled vacuum environment 82 is a controlled environment including a carrier gas at a pressure level of $10^{-5}$ to $10_{-6}$ torr. The carrier gas assists in the selective deposition of the vaporized emissive material through ports 88. In one embodiment, the carrier gas is argon. The pressure inside microeffusion cell 86 is greater than the pressure in pressure controlled vacuum environment 82. Therefore the vaporized emissive material in microeffusion cell 86 naturally moves towards the area of low pressure outside port 88.

In order to facilitate adherence of the vaporized emissive material to substrate 40, substrate 40 may be heated to a specified temperature. The temperature is selected so as to maximize the adherence of the vaporized stream of the emissive material molecules to the substrate 40. The molecules of vaporized emissive material that do not adhere to substrate 40 are vacuumed through vacuum tubes on either side of each port 88 to prevent cross contamination between adjacent emissive layer strips 46. The vacuum tubes will be discussed in more detail with relation to FIGS. 4 and 5.

Various variables may be altered to controlled the selective deposition process. Initially, the temperature of substrate 40 is chosen to obtain the best adhesion of the effused material. However, the temperature of substrate 40 may be altered to change the amount of the fused material that adheres to substrate 40. The temperature of each microeffusion cell 86 is chosen to provide a particular pressure level within the microetfusion cell 86 and to control the speed at which emissive material is effused from port 88. The microeffusion cell 86 temperature may be altered to change the effusion characteristics of the microeffusion cell 86.

Another variable in the selective deposition process is the size of each port 88. Altering the size of port 88 will alter the effusion rate and other effusion characteristics of the microeffusion cell 86. The pressured differential between the interior of each microeffusion cell 86 and pressure controlled vacuum environment 82 is initially chosen to provide an optimal effusion rate for the particular emissive material being effused from the microeffusion cell 86. Altering the pressure differential may result in altering the effusion rate and other characteristics of the selective deposition process. The pressure differential may be altered by changing the vacuum level of pressure controlled vacuum environment 82 or altering the temperature of microeffusion cell 86.

Figure 4:
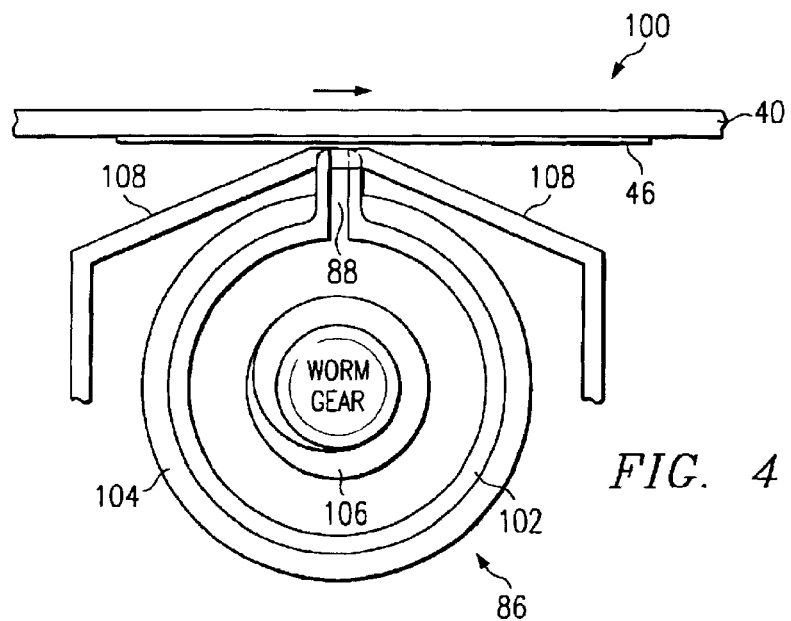
FIG. 4 illustrates a cross-section of a microeffusion cell as used in the apparatus of FIG. 3.
Figure 5:
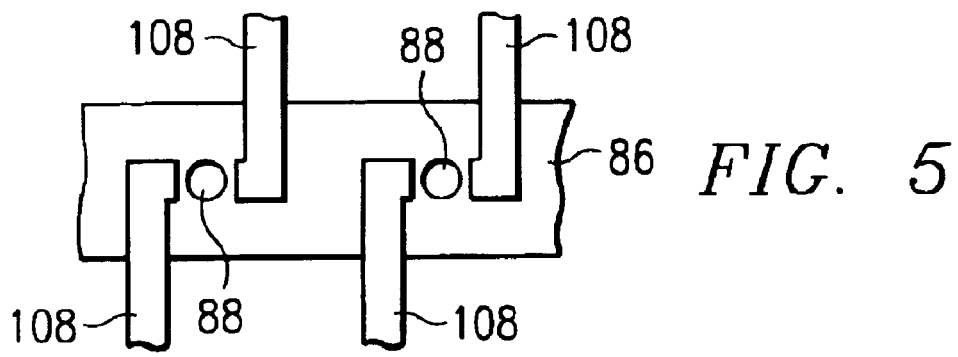
FIG. 5 illustrates vacuum tubes for minimizing cross contamination between emissive layer strips deposited by the apparatus of FIG. 3.

FIGS. 4 and 5 provide additional details of a microeffusion cell 86. Referring to FIG. 4, a crosssection of a microeftusion cell 86 is generally indicated at 100. Microeftusion cell 86 includes a cell wall 102 surrounded by a heater element 104. Since microeffusion cell 86 generally disperses solid emissive material in the form of powder through a sublimation process, an apparatus to evenly distribute the emissive material through microeffusion cell 86 may be used. In one embodiment, a worm gear 106 is used in the interior of microeffusion cell is 86 to move solid emissive material in the form of powder through the microeffusion cell 86. Although the present invention is described using a worm gear 106, other methods of distributing the solid emissive material through microeffusion cell 86 may be used including a plunger system, an air pressure system, an air vacuum system, or any other suitable means of distributing a solid material in the form of powder through microeffusion cell 86.

As previously described, the pressure differential between the interior of microeffusion cell 86 and the area outside port 88 determines the effusion rate of microeffusion cell 86. Therefore, the pressure gradient controls the selective deposition of emissive layer strips 46. If the pressure inside microeffusion cell 86 is greater than the pressure outside port 88, vaporized emissive material is effused through port 88 onto substrate 12. If the pressure inside microeffusion cell 86 is less than the pressure outside port 88, essentially no emissive material is effused through port 88. The pressure inside microeffusion cell is a function of the temperature of the emissive material, the size of port 88, and the pressure outside port 88. In addition, the temperature of the emissive material is a function of the heat applied by heater element 104, the molecule size of the emissive material, and the strength of the bonds in the emissive material.

A vacuum tube 108 exists on either side of port 88 to capture vaporized emissive material that does not adhere to substrate 12. Since substrate 12 is moved across port 88, the vacuum tubes are preferably placed on the sides of port 88 relative to the emissive layer strip 46 being selectively deposited by port 88. Details regarding the placement of vacuum tubes 108 are illustrated in FIG. 5.

Figure 6:
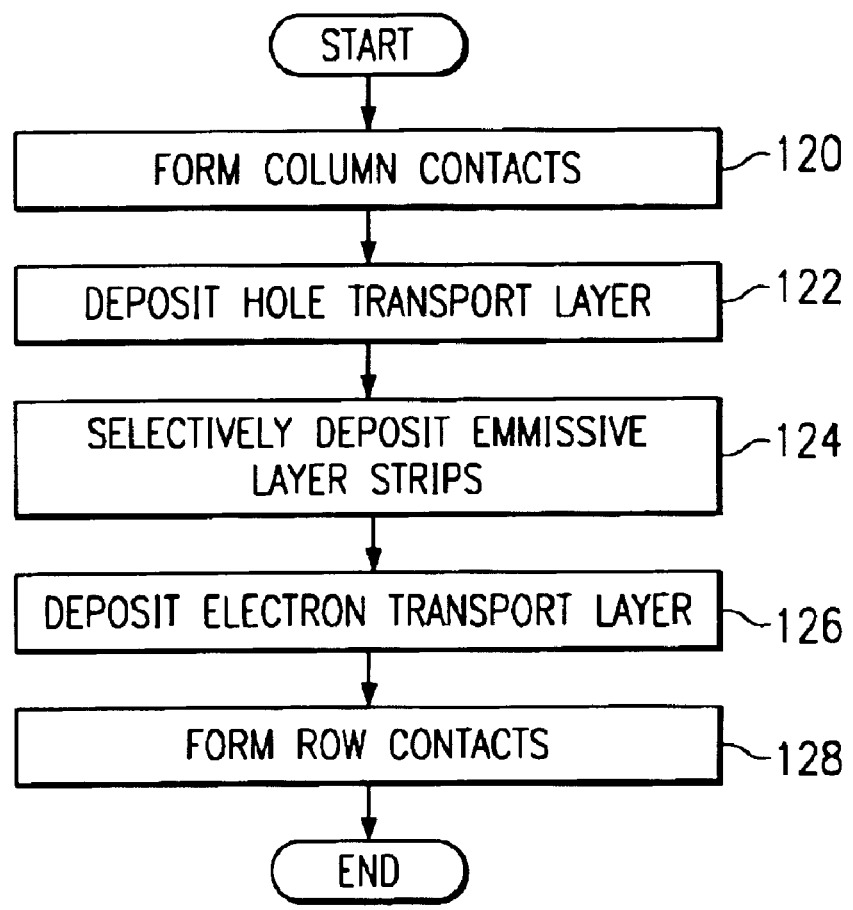
FIG. 6 is a flow diagram of a method for forming flat panel electroluminescent displays in accordance with one embodiment of the present invention.

FIG. 6 is a flow diagram illustrating a method for fabricating the flat panel display 10 in accordance with one embodiment of the present invention. In this embodiment, the flat panel display 10 is formed by a continuous process using strips of materials deposited by microeffusion cells 46. Accordingly large, flat panel displays can be fabricated quickly with minimal expense and processing steps.

Referring to FIG. 6, a method for forming an electroluminescent display commences at step 120 where column contacts 14 are formed. Column contacts 14 are formed by depositing a hole injector layer 42 onto an optically transparent substrate 40. Hole injector layer 42 is patterned and etched to form column contacts 14 orthogonal to a long side of substrate 40. This step prepares substrate 40 for selective deposition of emissive layer strips 46 by apparatus 80. Substrate 40 may be a continuous sheet of material or may be sized according to a size of the desired electroluminescent display. In either case, the length of substrate 40 is generally greater than its width. Substrate 40 may be further characterized as having parallel sides to form a generally rectangular shape. Substrate 40 may be rigid or flexible.

Hole injector layer 42 is deposited using conventional deposition techniques such as vapor deposition or chemical vapor deposition. After depositing hole injector layer 42, hole injector layer 42 is patterned and etched using conventional techniques to form column contacts 14. Hole injector layer 42 may be on the order of 1000 angstroms in thickness. Since this method is used to form a light emitting display, hole injector layer 42 is preferably formed from an optically transparent metal such as indium-tin-oxide. However, any suitable metal may be used. In one embodiment, hole injector layer 42 is formed from a high work function metal.

The method proceeds to step 122 where hole transport layer 44 is blanket deposited outwardly from hole injector layer 42. Hole transport layer 44 may be formed from any suitable material that allows holes to move from the bottom of hole transport layer 44 to the top of hole transport layer 44. As previously described, the material comprising hole transport layer 44 should also inhibit the passing of free electrons. In one embodiment, hole transport layer 44 is formed from an aromatic diamine such as NPB. Hole transport layer 44 may also be formed from an organic material. Hole transport layer 44 may be on the order of 1000 angstroms in thickness. Although hole transport layer 44 is described as being blanket deposited over hole injector layer 46, hole transport layer 44 may be patterned such that hole transport layer 44 exists only over hole injector layer 42.

The method proceeds to step 124 where emissive layer 46 is selectively deposited in strips outwardly from hole transport layer 44 by apparatus 80. Substrate 40 is inserted into apparatus 80 where microeffusion cells 86 selectively deposit emissive layer strips 46. Emissive layer strips 46 are deposited orthogonal to the column contacts 14 of hole injector layer 46. Selective deposition of emissive layer strips 46 allows a strip of material to be continuously deposited along the length of substrate 40 in a specified area without a separate patterning step and without contamination of adjacent emissive layer strips 46. Adjacent emissive layer strips 46 may be separated by a small area containing no emissive material. In one embodiment, this small area is on the order of 0.1 mm or less. Emissive layer strips may be on the order of 500 angstroms in thickness. As previously described, emissive layer strips 46 may be formed from any suitable material that emits a photon of light in a particular portion of the visible spectrum in response to the recombination of a hole and an electron. In one embodiment, emissive layer strips 46 emit photons of light in either the red, green, or blue portion of the visible spectrum in order to form pixels 24 for a flat panel color display. Emissive layer strips 46 alternate in color in order to form pixels 24.

The method proceeds to step 126 where electron transport layer 48 is blanket deposited outwardly from emissive layer strips 46. As previously described, electron transport layer 48 may be formed from any suitable material that allows free electrons to pass from the top side of electron transport layer 48 to the bottom side of electron transport layer 48 while inhibiting the passing of holes through electron transport layer 48. In one embodiment, electron transport layer 48 is formed from an oxadiazole derivative. Electron transport layer 48 may be on the order of 1,000 angstroms in thickness. Although electron transport layer 48 is described as being blanket deposited over emissive layer strips 46, electron transport layer 48 may be patterned or selectively deposited using apparatus 80 such that electron transport layer 48 only covers emissive layer strips 46.

The method proceeds to step 128 where row contacts 18 are formed. Row contacts 18 are formed by depositing, patterning, and etching an electron injector layer SO. The electron injector layer 50 is deposited, patterned and etched to form row contacts 18 outwardly from electron transport layer 48. Each row contact 18 exists immediately over an emissive layer strip 46. In another embodiment, electron injector layer 50 is selectively deposited to form row contacts 18 in a manner similar to the selective deposition of emissive layer strips 46. As previously described, electron injector layer So may be formed from any suitable low work function metal including a magnesium and silver alloy. Electron injector layer 50 may be on the order of 1,000 angstroms in thickness. The metal comprising electron injector layer 50 need not be transparent as is the metal comprising hole injector layer 46 since the photon of light emitted by emissive layer strips 46 is visible through the optically transparent substrate 12.

Thus, it is apparent that there has been provided in accordance with the present invention, a method for selective deposition of an emissive layer in electroluminescent displays that satisfies the advantage as set forth above such as elimination of a separate patterning step. Although the present invention and its advantages have been described in detail, it should be understood that various changes, substitutions, and alterations may be readily apparent to those skilled in the art and may be made without departing from the spirit and the scope of the present invention as defined by the following claims.

What is claimed is:

1. A method for forming an electroluminescent display, comprising:

providing a plurality of effusion cells, each effusion cell having a plurality of ports, the ports of each effusion cell offset from the ports of the other effusion cells;

providing an optically transparent substrate having a first plurality of contacts formed from a first metal and a first transport layer formed outwardly of the first contacts;

transporting the substrate across the plurality of effusion cells;

continuously effusing an emissive material from the ports in each effusion cell to form a plurality of emissive strips;

forming a second transport layer over the effused emissive material; and forming a second plurality of contacts, each second contact orthogonal to the first plurality of contacts and over one of the emissive strips.

2. The method of claim 1, wherein each emissive strip is separated from an adjacent emissive strip by less than 0.1 millimeter.

3. The method of claim 1, wherein each second contact corresponds to one of the plurality of emissive strips.

* * * * *